US008416965B2

(12) United States Patent
Hung

(10) Patent No.: US 8,416,965 B2
(45) Date of Patent: Apr. 9, 2013

(54) HARMONICS GENERATION APPARATUS AND METHOD THEREOF

(75) Inventor: Tien-Chiu Hung, Banqiao (TW)

(73) Assignee: Realtek Semiconductor Corp., Hsinchu (TW)

( * ) Notice: Subject to any disclaimer, the term of this patent is extended or adjusted under 35 U.S.C. 154(b) by 792 days.

(21) Appl. No.: 12/571,701

(22) Filed: Oct. 1, 2009

(65) Prior Publication Data

US 2010/0086147 A1 Apr. 8, 2010

Related U.S. Application Data

(60) Provisional application No. 61/102,362, filed on Oct. 3, 2008.

(51) Int. Cl.
*H03G 5/00* (2006.01)

(52) U.S. Cl. ........................................... 381/98; 381/61

(58) Field of Classification Search .................... 381/17, 381/28, 61, 63, 98, 101, 103; 333/28 R
See application file for complete search history.

(56) References Cited

U.S. PATENT DOCUMENTS

| | | | | |
|---|---|---|---|---|
| 4,150,253 | A | 4/1979 | Knoppel | |
| 4,586,417 | A * | 5/1986 | Kato et al. | 84/630 |
| 4,700,390 | A | 10/1987 | Machida | |
| 5,668,885 | A | 9/1997 | Oda | |
| 5,771,296 | A | 6/1998 | Unemura | |
| 5,930,373 | A | 7/1999 | Shashoua et al. | |
| 6,111,960 | A | 8/2000 | Aarts et al. | |
| 6,606,388 | B1 * | 8/2003 | Townsend et al. | 381/17 |
| 2005/0265561 | A1 * | 12/2005 | Manish et al. | 381/61 |
| 2006/0159283 | A1 | 7/2006 | Mathew et al. | |

OTHER PUBLICATIONS

E. Larsen and R.M. Aarts "Reproducing Low-Pitched Signals Through Small Loudspeakers" J. Audio Eng. Soc., vol. 50, No. 3: 147-164, Mar. 2002.

* cited by examiner

*Primary Examiner* — Vivian Chin
*Assistant Examiner* — Friedrich W Fahnert
(74) *Attorney, Agent, or Firm* — McClure, Qualey & Rodack, LLP

(57) ABSTRACT

A harmonic generating apparatus and the method are provided, which are used to enhance the quality of the bass audio signals. The method includes the steps of: providing a frequency signal having a present level and a preceding level; comparing the present level with the preceding level to generate a compared result; and generating the plurality of harmonics based on the compared result.

18 Claims, 10 Drawing Sheets

HARMONICS GENERATION APPARATUS AND METHOD THEREOF

RELATED APPLICATIONS

This application claims benefit of priority to U.S. Provisional Application No. 61/102,362, filed Oct. 3, 2008, the entire disclosure of which is incorporated herein by reference.

FIELD OF THE INVENTION

The present invention relates to a harmonic generating apparatus and method thereof, and more particularly to a harmonic generating apparatus and method thereof used for speaker reproduction system.

BACKGROUND OF THE INVENTION

Today's consumer electronic devices are designed toward being short, small, light and thin or with portability. This design paradigm leads to smaller speakers in all portable electronic devices. The resulting smaller physical dimension of the speakers severely limits in sound reproduction, especially in the low frequency registers, leading to consumer dissatisfaction with the sound output quality. A conventional solution to this problem is to amplify the low frequency components in the sound signal. However, this increased energy level not only leads to the extra power consumption, but also results in the speaker damage as well.

A better solution to improve the reproduction performance without boosting low frequency component is to utilize psychoacoustic techniques. Psychoacoustic technique demonstrates the existence of a phenomenon in harmonics known as 'virtual pitch", in which a frequency in the greatest common factor in harmonic frequencies is sensed in the brain to make people incorrectly hear sound whose frequency is close to the fundamental frequency, even if the amplitude of the fundamental frequency is zero. Thus, we can use the "virtual pitch" to make consumers feel low-frequency sound signals unable to be reproduced by speakers.

Using a full wave rectifier to generate harmonics is disclosed by the U.S. Pat. Nos. 5,668,885 and 5,771,296. A full wave rectifier and a full wave integration to generate harmonics are disclosed by a paper, "Reproducing Low-Pitched Signals through Small Loudspeakers".

Signal clipping to generate harmonics is disclosed by the U.S. Pat. Nos. 4,150,253 and 4,700,390. Generating harmonics by a feedback loop from an output to an input is disclosed by the U.S. Pat. No. 5,930,373. A zero-crossing detector for detecting zero crossings in an input signal is disclosed by the U.S. Pat. No. 6,111,960. Modulating the input signal with at least one frequency signal to generate harmonics is disclosed by the US Patent Publication No. 2006/0159283.

The full wave rectifier is easily implemented, however it just generates even harmonics. The pitch of harmonics for the bass signals is perceived to be twice the fundamental frequency, namely, double the frequency as the original sound. This means the synthetic bass sounds an octave high to the input signal. The clipper, on the other hand, only generates odd harmonics. Previous harmonic generators also have a problem that the output spectrum envelope decay speed cannot be controlled. The speed is related to the harmonic amount that influences the perceived sound quality.

Another prior art, which uses a modified envelope detection, is disclosed by the US Patent No. 2005/0265561, and the output spectrum envelope decay speed is controlled with the parameter which is determined by comparing the input signal with the feedback signal. However, the problem to the method lies in that the harmonic envelope decay speed is not a wide range, and the phase of the output harmonics cannot be easily and arbitrarily modulated.

The above-mentioned harmonic generators also contain a drawback incapable to decide the output spectrum envelopes. If the system cut-off frequency range is high, it means the frequency range needed to be enhanced is wider. Oftentimes, the excessive or too many harmonic terms in the output actually are not necessary since the harmonic as such also influences on the higher frequency components of the original audio signal. Often, several (almost three) strong bins is needed to enhance the bass component and others are weak bins. These methods are unable to determine the output spectrum envelopes. Thus, for achieving this effect, a sharp filter must be used to filter the unnecessary harmonic components and leave the main ones. However, the sharp filters have the drawback of the high computing complexity.

It is therefore attempted by the applicant to deal with the above situation encountered in the prior art.

SUMMARY OF THE INVENTION

In accordance with the first aspect of the present invention, a method for generating a harmonic signal is provided, and the method comprises steps of: delaying the input signal according to a first predetermined time to produce a delayed signal; comparing the input signal and the delayed signal to generate a compared result; determining a coefficient according to the compared result; and generating the harmonic signal based on the determined coefficient and the input signal.

Preferably, the compared result is generated according to the relationship between the compared result and a constant value.

Preferably, the step of generating the harmonic signal further comprises the steps of: determining the coefficient based on the compared result; delaying the harmonic signal according to a second predetermined time to a delayed harmonic signal; and mixing the delayed harmonic signal and the input signal according to the generating the harmonic signal according to the coefficient to produce the harmonic signal.

Preferably, the step of determining the coefficient further comprises the steps of: selecting one of a plurality of coefficients according to the compared result to output the determined coefficient.

Preferably, the step of generating the harmonic signal further comprises steps of: adjusting the input signal according a first coefficient of the determined coefficient to produce a first adjusted signal; delaying the harmonic signal according a second predetermined time to generate a delayed harmonic signal; adjusting the delayed harmonic signal according a second coefficient of the determined coefficient to produce a second adjusted signal; and mixing the first adjusted signal and the second adjusted signal to produce the harmonic signal.

Preferably, the first predetermined time is a predetermined sample number.

Preferably, the coefficient comprises a first coefficient and a second coefficient, and the first coefficient and the second coefficient have a sum being a constant.

Preferably, the step of comparing the input signal and the delayed signal further comprise the steps of: performing an absolute value operation on the input signal.

In accordance with the second aspect of the present invention, an apparatus for generating a harmonic signal, is provided, and the apparatus comprises: a first delay circuit to delay an input signal according to a predetermined time to generate a delayed signal; a comparing circuit to compare an input signal with the delayed signal to generate a compared result; and a computing circuit, coupled to the comparing circuit, to generate the harmonic signal based on the compared result and the input signal.

Preferably, the comparing circuit generates the compared result according to the input signal, the delayed signal, and a constant value.

Preferably, the computing circuit further comprises a coefficient determining circuit coupled to the comparing circuit, to select one of a plurality of coefficients according to the compared result and generating a determined coefficient.

Preferably, the first coefficient is determined as a first value when the compared result is of a first condition, and the first coefficient is determined as a second value when the compared result is of a second condition.

Preferably, the computing circuit further comprises: a second delay circuit to delay the harmonic signal to generate a delayed harmonic signal; and a mixing circuit to mix the input signal and the delayed harmonic signal according to the determined coefficient to produce the harmonic signal.

Preferably, the mixing circuit further comprises: a first multiplying circuit, coupled to the coefficient determining circuit, to adjust the input signal according to a first coefficient of the determined coefficient to generate a first processed signal; a second multiplying circuit, coupled to the first multiplying circuit and the delay circuit, to adjust the delayed harmonic signal according to a second coefficient of the determined coefficient to generate a second processed signal; and an adder to mix the first processed signal and the second processed signal to produce the harmonic signal.

Preferably, the first predetermined time is a predetermined sample number.

Preferably, the apparatus further comprises an absolute value processing circuit to perform an absolute value operation on the input signal, and to output the absolute value to the first delay circuit and the comparing circuit.

In accordance with the third aspect of the present invention, a computer-readable program is provided, and the computer-readable program comprises: a comparing code comparing a present level of an inputting signal with a preceding level of the inputting signal and generating a compared result; and an operating code generating a plurality of harmonics according to the compared result.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
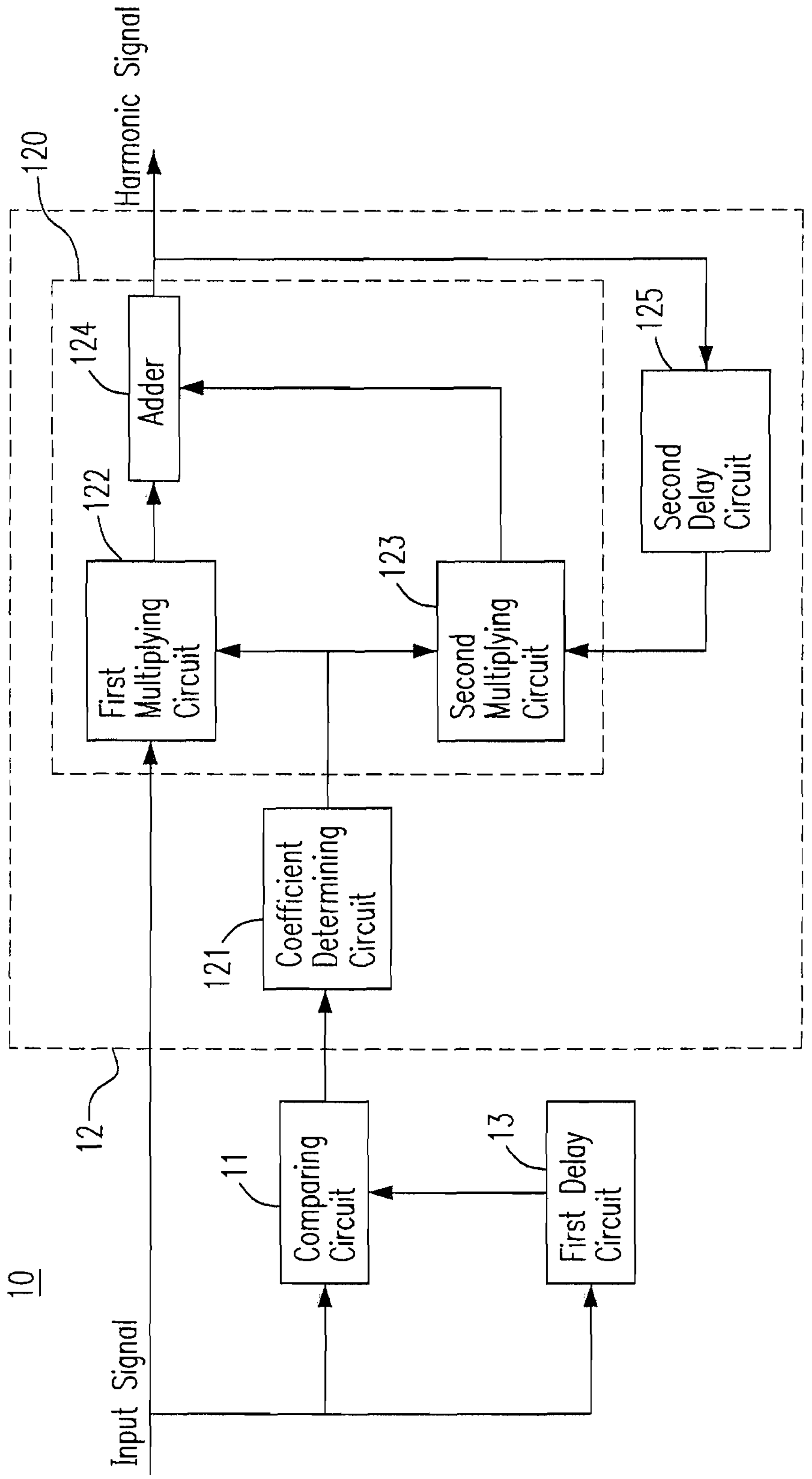
FIG. 1 is a diagram showing a harmonic generating apparatus in the first scheme embodiment of the present invention.

Please refer to FIG. 1, which is a diagram illustrating a first preferred scheme embodiment of the harmonic generating apparatus according to the present invention. In the first preferred scheme embodiment, the harmonic generating apparatus 10 includes a first delay circuit 13, a comparing circuit 11 and a computing circuit 12. The connection relationships thereamong are referred to FIG. 1.

In this embodiment, the computing circuit 12 includes a coefficient determining circuit 121, a mixing circuit 120 and a second delay circuit 125. The mixing circuit 120 further includes a first multiplying circuit 122, a second multiplying circuit 123 and an adder 124. The connection relationships thereamong are referred to FIG. 1.

In this embodiment, an input signal is inputted to the comparing circuit 11 and the first delay circuit 13 respectively. The input signal is delayed by the first delay circuit 13 for a predetermined time to generate a delayed signal. In practice, the "sample number" could be a preferred delay unit of the predetermined time. Then the delayed signal is transmitted to the comparing circuit 11. In this embodiment, the predetermined sample number is selected as 1, but it is not limited in 1 in the present invention. The input signal, the delayed signal and a constant value are compared by the comparing circuit 11, and a compared result is generated thereby and transmitted to the computing circuit 12, wherein the following conditions are included in the compared result: (1) a level of the input signal is smaller than the constant value; (2) a level of the input signal is larger than or equal to the constant value, and the level of the input signal is larger than or equal to the level of the delayed signal; and (3) the level of the input signal is larger than or equal to the constant value, and the level of the input signal is smaller than the level of the delayed signal. In this embodiment, the constant value is 0, but it is not limited in 0 in the present invention. Since the input signal is an audio signal, it is a low frequency signal.

A coefficient is determined by the coefficient determining circuit 121 based on different conditions, and the determined coefficient includes a first coefficient and a second coefficient. For example, a first coefficient of the determined coefficient is determined as a first value based on the condition (1) by the coefficient determining circuit 121, and a second coefficient of the determined coefficient is determined as a second value correspondingly by a relation; the first coefficient of the determined coefficient is determined as a third value based on the condition (2), and the second coefficient of the determined coefficient is determined correspondingly as a fourth value by the relation; and the first coefficient of the determined coefficient is determined as a fifth value based on the condition (3), and the second coefficient of the determined coefficient is determined correspondingly as a sixth value by the relation. In this embodiment, the relation is referred to that sum of the first coefficient of the determined coefficient and the second coefficient of the determined coefficient is 1. For example, when the compared result is of condition (1), if the first coefficient of the determined coefficient is determined as a, the second coefficient of the determined coefficient is determined as (1-a) correspondingly. When the compared result is condition (2), if the first coefficient of the determined coefficient is determined as β, the second coefficient of the determined coefficient is generated as (1-β) correspondingly. When the compared result is condition (3), if the first coefficient of the determined coefficient is determined as γ, the second coefficient of the determined coefficient is determined as (1-γ) correspondingly. In the present invention, however, the relation of the sum of the first coefficient and the second coefficient is not limited in 1.

The input signal and the determined coefficient are transmitted to the mixing circuit 120 to generate a harmonic signal. Among these, the first coefficient and the second coefficient of the determined coefficient are served as multiplicators of the first multiplying circuit 122 and the second multiplying circuit 123. In the first multiplying circuit 122, the input signal is adjusted according to the first coefficient of the determined coefficient, and a first processed signal is generated and transmitted to the adder 124. In the second multiplying circuit 123, a delayed harmonic signal generated by the second delay circuit 125 according to a second predetermined time is adjusted according to the second coefficient, and a second processed signal is generated and transmitted to the adder 124. The first processed signal and the second processed signal are mixed in the adder 124 and the harmonic signal is produced. The harmonic signal is delayed by the second delay circuit 125 to generate the delayed harmonic signal.

Figure 2A:
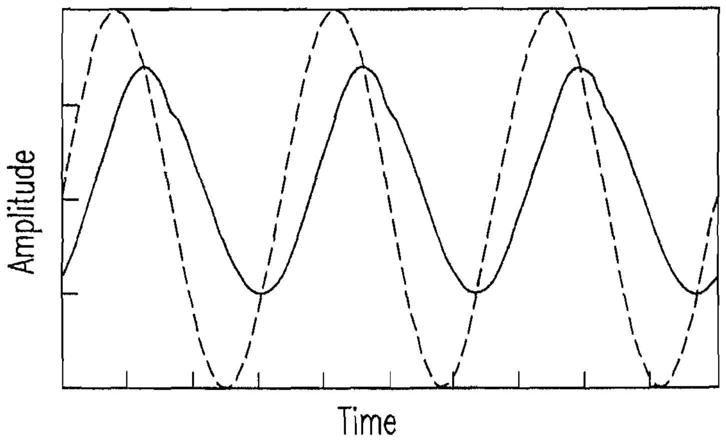
FIG. 2(A) and FIG. 2(B) are the diagrams showing the harmonic signal of a sinusoidal signal in (A) time domain and (B) frequency domain respectively, which are obtained by adopting the compared results under three conditions according to the first scheme embodiment in FIG. 1.
Figure 2B:
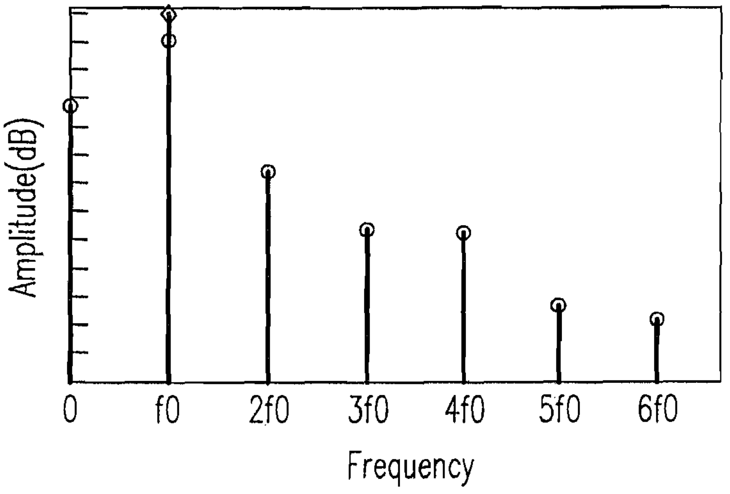

An input signal, which is a sinusoidal signal, and a harmonic signal thereof in the time domain are shown in FIG. 2(A), wherein the input signal is presented as a dash line and the produced harmonic signal is presented as a solid line. FIG. 2(A) is an embodiment based on FIG. 1 and is obtained by computing the first and the second coefficients of the determined coefficient determined under three conditions of the above-mentioned compared result. However, the input signals able be applied in this invention are not limited in the sinusoidal signals. The distribution of the frequency domain in FIG. 2(A) is shown in FIG. 2(B), wherein the spectrum of the input signal is presented as a diamond and the spectrum of the produced harmonic signal is shown as a circle, whereby it could be found that significant attenuation begins at quintuple f.sub.0 (the fifth harmonic) rather than the quadruple $f_0$ (the fourth harmonic).

In the second preferred embodiment, four conditions are included in the abovementioned compared result: (1) the level of the input signal is smaller than the constant value, and the level of the input signal is larger than or equal to the level of the delayed signal; (2) the level of the input signal is smaller than the constant value, and the level of the input signal is smaller than the level of the delayed signal; (3) the level of the input signal is larger than or equal to the constant value, and the level of the input signal is larger than or equal to the level of the delayed signal; and (4) the level of the input signal is larger than or equal to the constant value, and the level of the input signal is smaller than the level of the delayed signal. In the third preferred embodiment for the harmonics generation, the input signal is only compared with the delayed signal, but is not compared with the constant value. Thus, two conditions are obtained: (1) the level of the input signal is larger than or equal to the level of the delayed signal; and (2) the level of the input signal is smaller than the level of the delayed signal. Similarly, the first coefficient and the second coefficient of the determined coefficient are determined by the coefficient determining circuit 121 based on the compared result under the individual conditions.

Figure 3A:
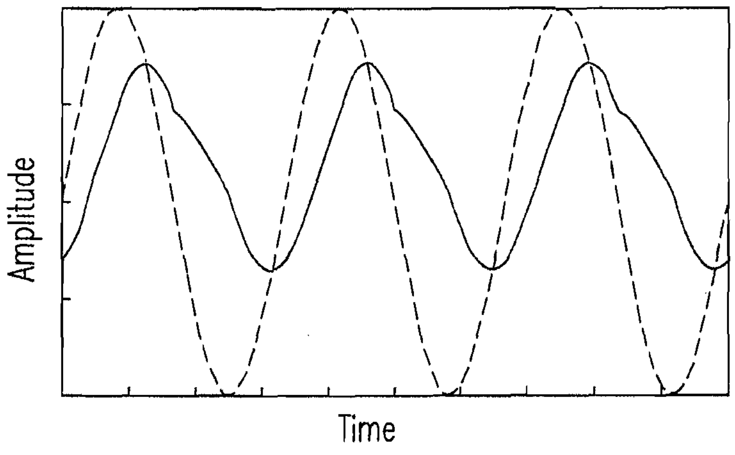
FIG. 3(A) and FIG. 3(B) are the diagrams showing the harmonic signal of a sinusoidal signal in (A) time domain and (B) frequency domain respectively, which are obtained by adopting the compared results under four conditions according to the first scheme embodiment in FIG. 1.
Figure 3B:
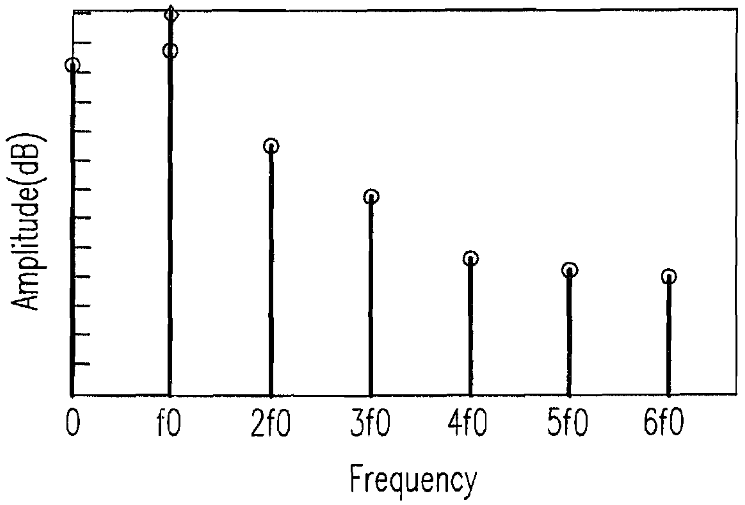

An input signal, which is a sinusoidal signal, and harmonics thereof in the time domain are shown in FIG. 3(A), wherein the input signal is presented as the dash line and the produced harmonic signal is presented as the solid line. FIG. 3(A) is an embodiment based on FIG. 1 and is obtained by computing the determined coefficient in the above-mentioned compared result under four conditions. However, the input signals that may be applied in this invention are not limited to the sinusoidal signals. The distribution of the frequency domain in FIG. 3(A) is shown in FIG. 3(B), wherein the spectrum of the input signal is presented as a diamond and the spectrum of the produced harmonic signal is shown as a circle, whereby it could be found that the second and the third harmonics are the main harmonic components, and the others have more significant attenuation.

Figure 4A:
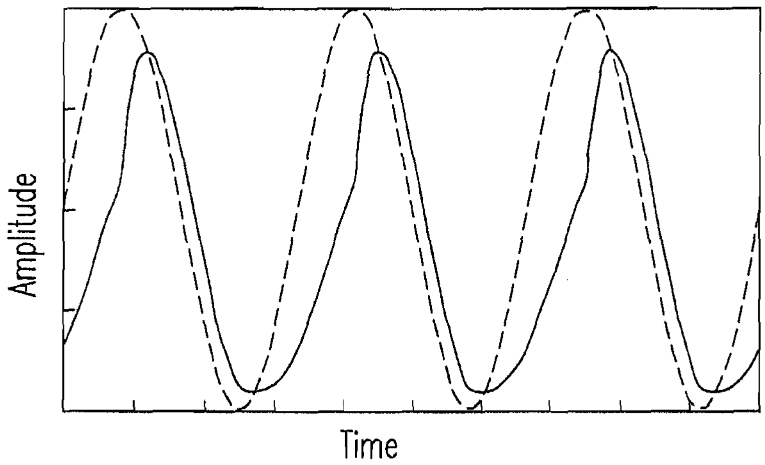
FIG. 4(A) and FIG. 4(B) are the diagrams showing the harmonic signal of a sinusoidal signal in (A) time domain and (B) frequency domain respectively, which are obtained by adopting the compared results under four conditions according to the first scheme embodiment in FIG. 1.
Figure 4B:
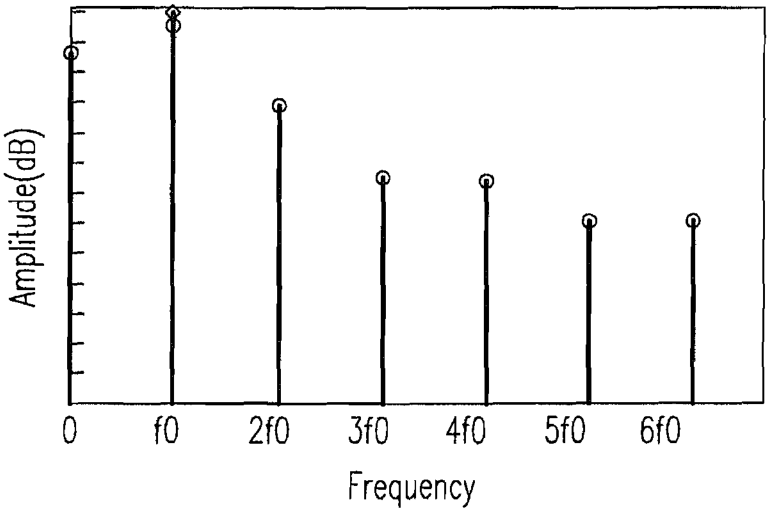

In another corresponding embodiment of this invention, if the level of the input signal is only compared with the level of the delayed signal rather than the constant value in the comparing circuit 11 of FIG. 1, two conditions are obtained: (1) the level of the input signal is larger than or equal to the level of the delayed signal; and (2) the level of the input signal is smaller than the level of the delayed signal. A diagram showing the input signal, being a sinusoidal signal, and its harmonic signal in the time domain are shown in FIG. 4(A). FIG. 4(A) is obtained according to the embodiment in FIG. 1 and is computed by the determined coefficient of the abovementioned comparing results under two conditions. However, the input signals able to be applied in this invention are not limited to the sinusoidal signals. The distribution of the frequency domain in FIG. 4(A) is shown in FIG. 4(B), wherein the spectrum of the input signal is presented as a diamond and the spectrum of the produced harmonic signal is presented as a circle, whereby it could be found that significant attenuation begins at the quintuple $f_0$ (the fifth harmonic) rather than the quadruple f0 (the fourth harmonic).

However, in this invention, other methods for bending original smooth input signal by comparing the input signal with the delayed signal could be included to produce harmonic signal.

Figure 5:
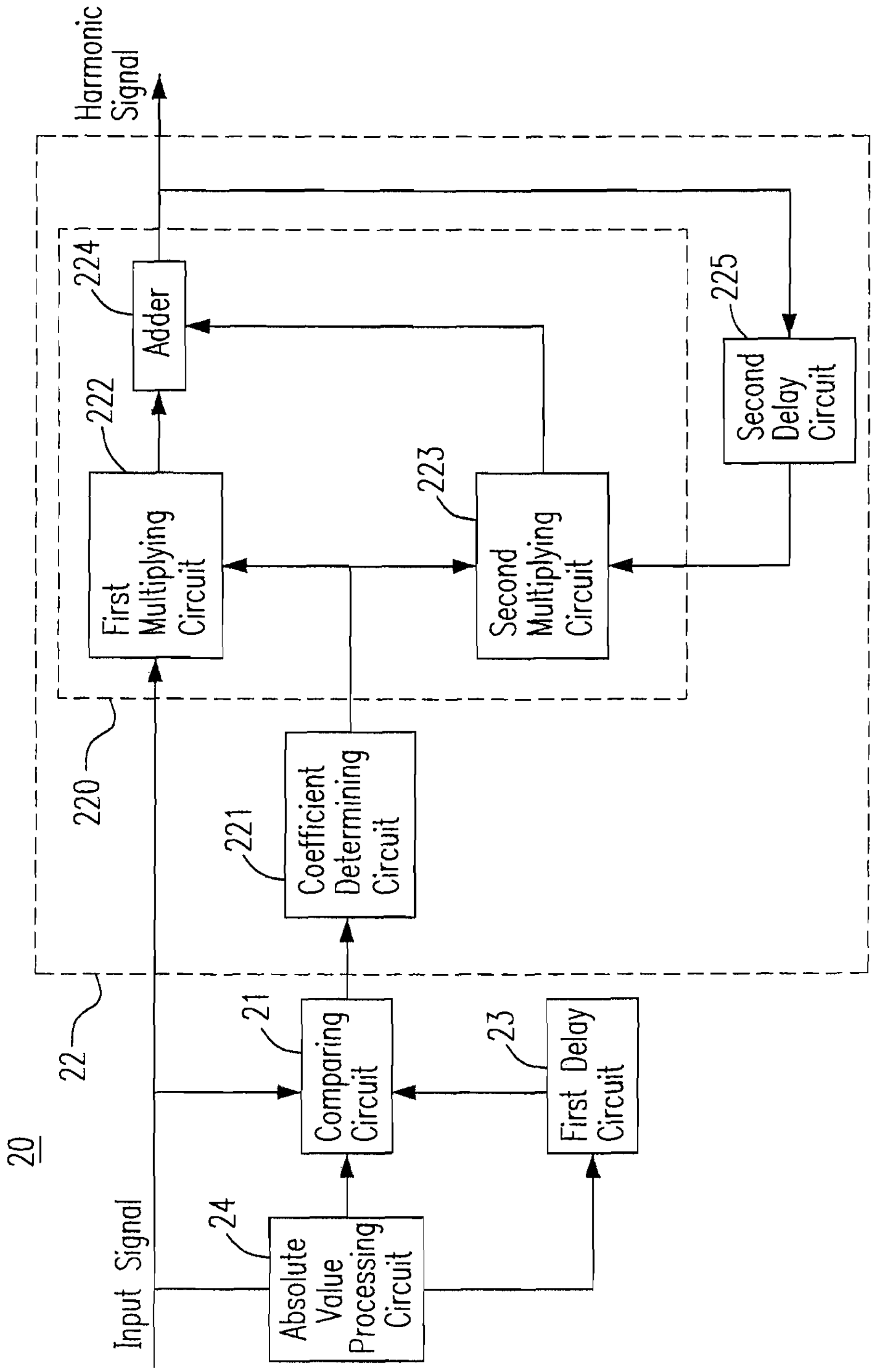
FIG. 5 is a diagram showing the harmonic generating apparatus in the second scheme embodiment of the present invention.
Figure 6A:
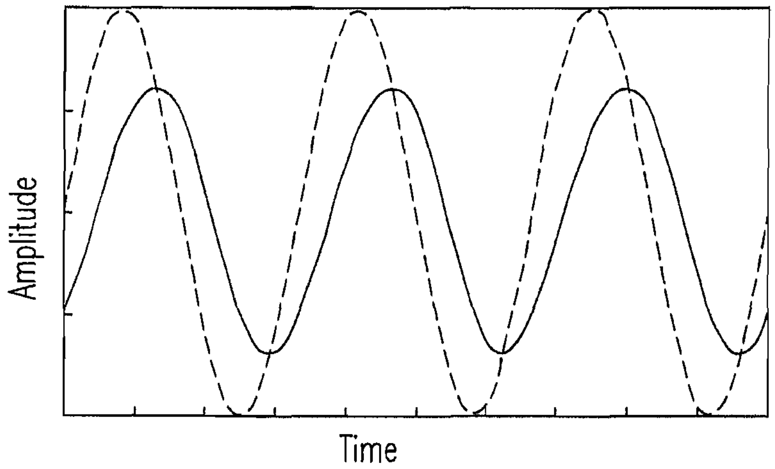
FIG. 6(A) and FIG. 6(B) are the diagrams showing the harmonic signal of a sinusoidal signal in (A) time domain and (B) frequency domain respectively, which are obtained by adopting the compared results under three conditions according to the second scheme embodiment in FIG. 5.
Figure 6B:
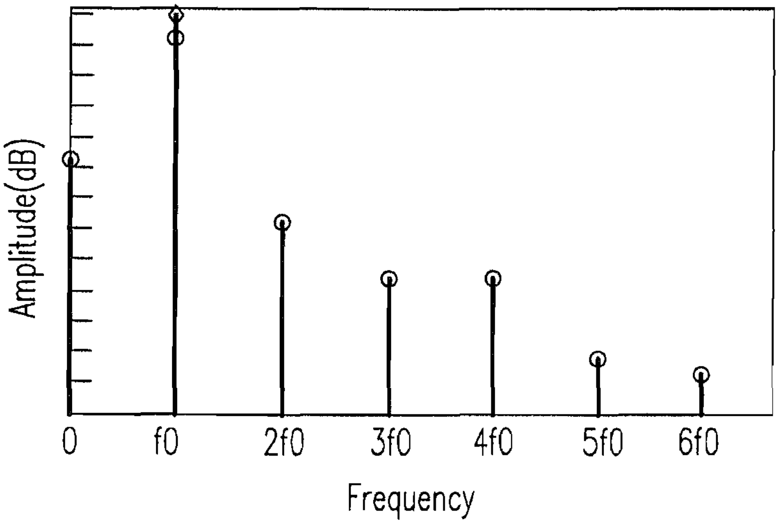

Please refer to FIG. 5, wherein a second preferred scheme embodiment diagram of the harmonic generating apparatus of the invention is shown. In the second preferred scheme embodiment, an absolute value processing circuit 24 is added. The input signal is received by the absolute value processing circuit 24. After the treatment of the absolute value processing circuit 24, the input signal is transmitted to the first delay circuit 23 and the comparing circuit 21 respectively. Other functions in the circuit are similar to the corresponding elements in FIG. 1, and thus the illustrations are omitted. An input signal, which is a sinusoidal signal, and a harmonic signal thereof in the time domain are shown in FIG. 6(A). FIG. 6(A) is an embodiment based on FIG. 5 and is obtained by computing the determined coefficient of the above-mentioned compared result under three conditions (similar to the related description of the above-mentioned comparison result under three conditions in FIG. 1). However, the input signals applicable in this invention are not limited to the sinusoidal signals. The distribution of the frequency in FIG. 6(A) is shown in FIG. 6(B), wherein the spectrum of the input signal is presented as a diamond and the spectrum of the produced harmonic signal is presented as a circle, whereby it could be found that significant attenuation begins at quintuple f0 (the fifth harmonic).

Figure 7A:
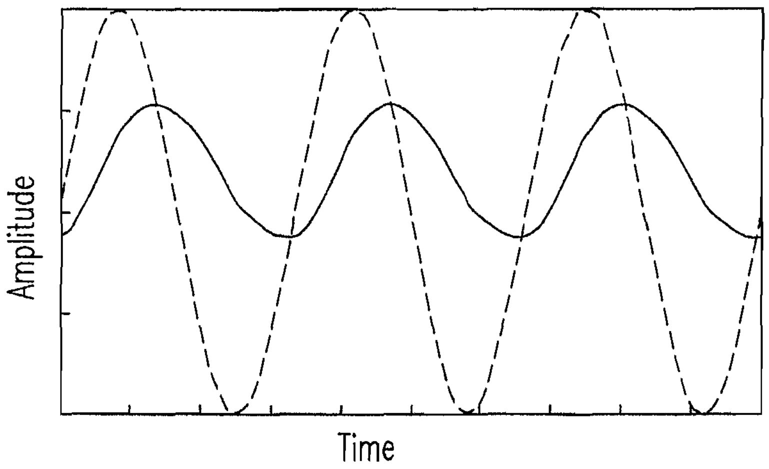
FIG. 7(A) and FIG. 7(B) are the diagrams showing the harmonic signal of a sinusoidal signal in (A) time domain and (B) frequency domain respectively, which are obtained by adopting the compared results under four conditions according to the second scheme embodiment in FIG. 5.
Figure 7B:
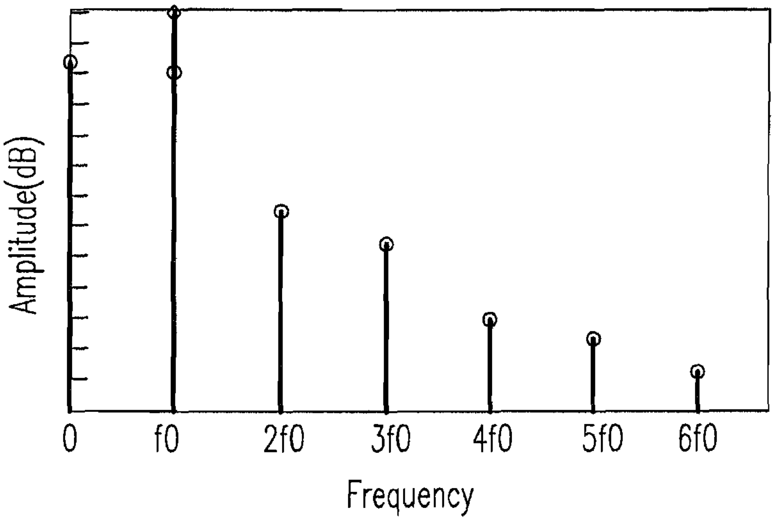

An input signal, which is a sinusoidal signal, and a harmonic signal thereof in the time domain are shown in FIG. 7(A). FIG. 7(A) is an embodiment based on FIG. 5 and is obtained by computing the determined coefficients of the above-mentioned comparison result under four conditions (similar to the related description of the above-mentioned comparison result under four conditions in FIG. 1). However, input signals applicable in this invention are not limited to the sinusoidal signals. The distribution of the frequency domain in FIG. 7(A) is shown in FIG. 7(B), wherein the spectrum of the input signal is presented as a diamond and the spectrum of the produced harmonic signal is presented as a circle, whereby it could be found that significant attenuation begins at quadruple ID (the fourth harmonic).

Figure 8A:
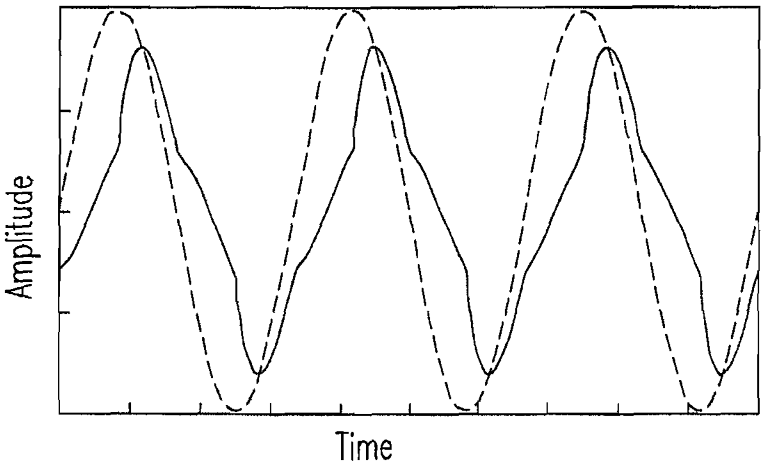
FIG. 8(A) and FIG. 8(B) are the diagrams showing the harmonic signal of a sinusoidal signal in (A) time domain and (B) frequency domain respectively, which are obtained by adopting the compared results under two conditions according to the second scheme embodiment in FIG. 5.
Figure 8B:
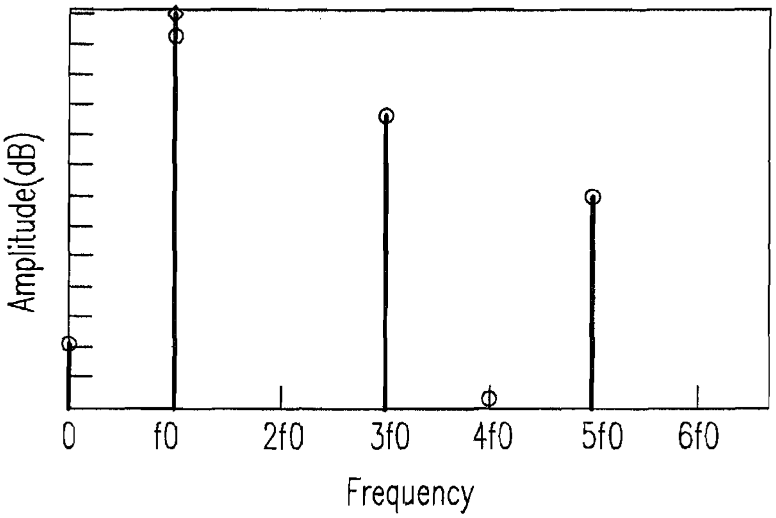

In another harmonic generating embodiment corresponding to this invention, if the level of the input signal is only compared with the level of the delayed signal rather than the constant value in the comparing circuit 21 in FIG. 5, two conditions are obtained: (1) the absolute value of the level of the input signal is larger than or equal to that of the level of the delayed signal; and (2) the absolute value of the level of the input signal is smaller than that of the level of the delayed signal. An input signal, which is a sinusoidal signal, and harmonic signal thereof in the time domain are shown in FIG. 8(A). FIG. 8(A) is an embodiment based on FIG. 5 and is obtained by computing the determined coefficient of the abovementioned comparing result under four conditions. However, the input signals applicable in this invention are not limited to the sinusoidal signals. The distribution of the frequency in FIG. 8(A) is shown in FIG. 8(B), wherein the spectrum of the input signal is presented as a diamond and the spectrum of the produced harmonic signal is presented as a circle. Only the odd harmonics are produced from the output, as similar to the outcome of using signal clipping. However, an advantage of this method lies in that the configuration of the clipping threshold is not necessary. If the clipping threshold is not configured as well, it will result in the amplitudes of the input signal being smaller than the clipping threshold, and thus makes the clipping false. The issue is avoided by this method.

Figure 9:
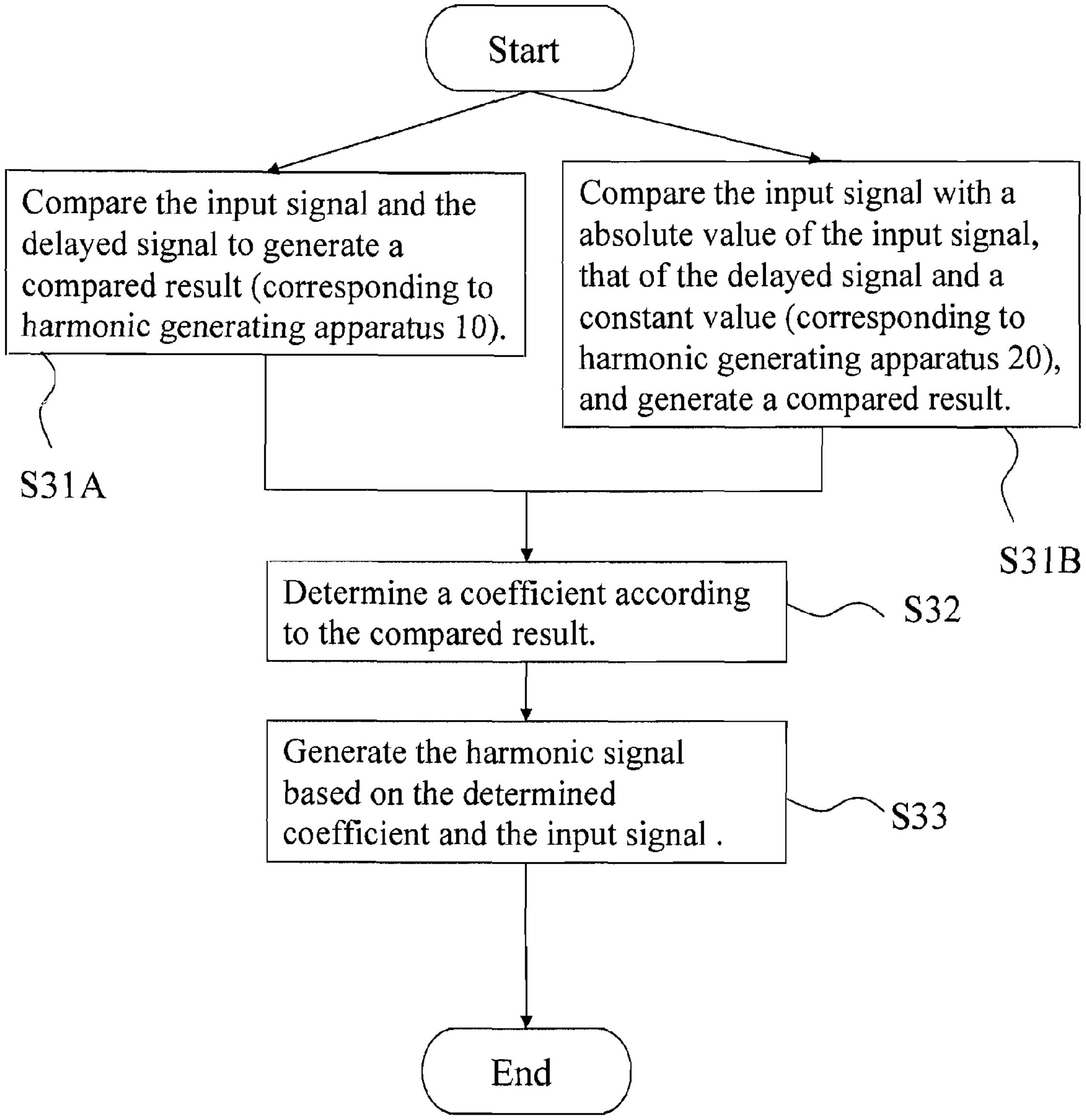
FIG. 9 is a flow chart showing the harmonic generating method in the present invention.

Please refer to FIG. 9, which further illustrates a flow chart of the harmonic generating method of the present invention. The Steps of the generating method corresponding to the harmonic generating apparatus 10 of FIG. 1 include: steps S31A, S32 and S33. The Steps of the generating method corresponding to the harmonic generating apparatus 20 of FIG. 5 include: steps S31B, S32 and S33. For steps S31A, S31B, S32 and S33, the corresponding illustrations and the contents of FIG. 9 could be obtained from the related descriptions of FIG. 1 and FIG. 5 as mentioned above. Accordingly, the illustrations are omitted.

The flow chart could be also implemented as a computer-readable program or software by programming languages such as, C/C++, C#, Java, MATLAB, etc.

However, in this invention, other methods for bending original smooth input signal by comparing the input signal with the delayed signal could be included to produce harmonic signal.

From FIGS. 2(A)-2(B), 3(A)-3(B), 6(A)-6(B) and 7(A)-7(B), it could be understood that the harmonic components (of the harmonic signals produced via the determined coefficient in the example) neighboring to the fundamental frequency form the main harmonic components having relative higher energy, such as the second to the fourth harmonics. As to the rest harmonic components farther from the fundamental frequency, the energy shows significant attenuation relative to the main harmonic components. Thus, when the rest harmonic components are filtered, the sharp filters are not necessary, and the drawbacks of high complexity of the sharp filters are avoided.

Figure 10:
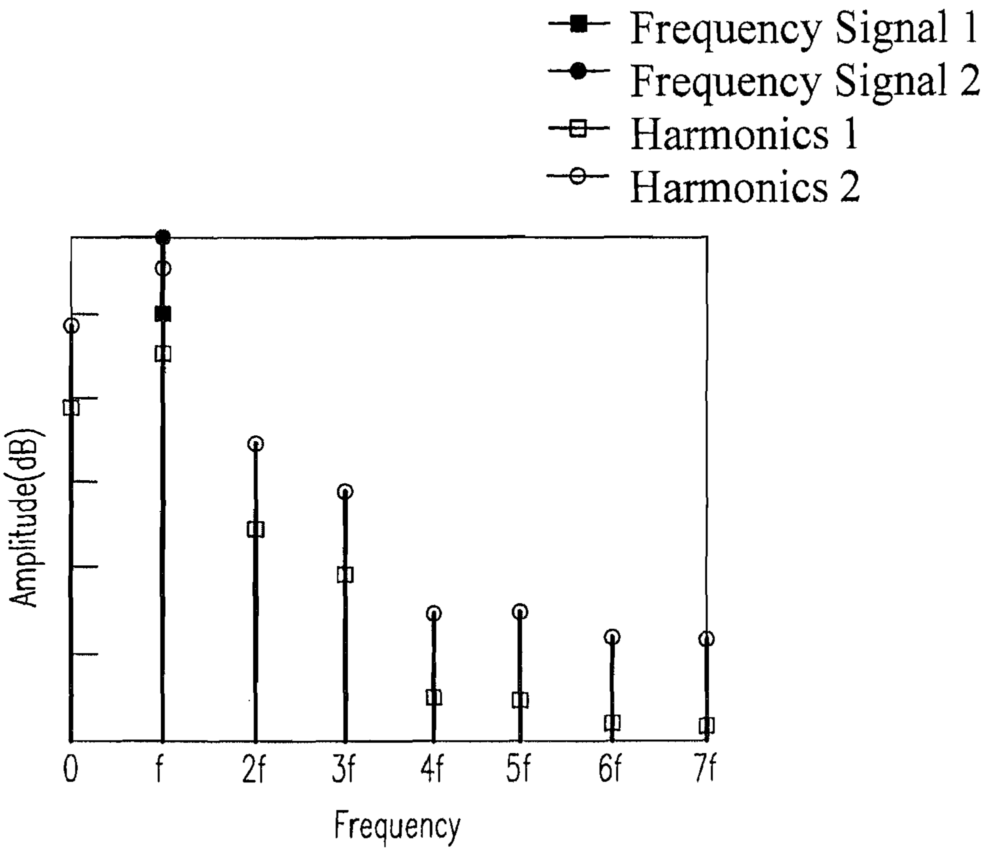
FIG. 10 is a diagram showing the relationships between the signals with different amplitudes and the output harmonic signals in frequency.

A spectrum distribution, which includes the input signals and the spectrums of the corresponding produced harmonic signals, is shown in FIG. 10, wherein two different input signals are presented as a solid circle and a solid square respectively, and the spectrums of the produced harmonic signals corresponding to the two different input signals are presented as a hollow circle and a hollow square. Thus, it could be found that a constant difference of 1 dB is shown between the spectrum envelopes of the harmonic signals and that of input signals, and the spectrum envelopes only depend on the frequency of the input signals, rather than the levels of the input signals.

In the embodiments of the present invention, it is well known by one skilled in the art that the circuits could be implemented by various approaches. For example, the first delay circuit 13 or the second delay circuit 125 could be implemented by a delay element, a FIFO (First-In, First-Out) buffer, a register, or some other memories. For another example, the coefficient determining circuit 121 could be a selector, a multiplexer, a lookup table circuit, or a memory (by using address as an index to output a coefficient stored in the memory). For a further example, hardware description languages, such Verilog or VHDL, could be used to implement the whole circuit, or all the above-mentioned operations (such as delaying, multiplexing, adding, coefficient determining) could be implemented by a CPU operating in coordination with software, or a controller operating in coordination with firmware.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for generating a harmonic signal corresponding to an audio input signal, comprising steps of: delaying the input signal according to a first predetermined time to produce a delayed signal; comparing the audio input signal and the delayed signal to generate a compared result; determining a coefficient according to the compared result; and generating the harmonic signal based on the determined coefficient and the audio input signal.

2. The method of claim 1, wherein the compared result is generated according to the relationship among the audio input signal, the delayed signal and a constant value.

3. The method of claim 1, wherein the step of generating the harmonic signal further comprises: delaying the harmonic signal according to a second predetermined time to generate a delayed harmonic signal; and mixing the delayed harmonic signal and the audio input signal according to the coefficient to produce the harmonic signal.

4. The method of claim 3, wherein the step of determining the coefficient further comprises: selecting one of a plurality of coefficients according to the compared result to output the determined coefficient.

5. The method of claim 1, wherein the step of generating the harmonic signal further comprises: adjusting the audio input signal according a first coefficient of the determined coefficient to produce a first adjusted signal; delaying the harmonic signal according a second predetermined time to generate a delayed harmonic signal; adjusting the delayed harmonic signal according a second coefficient of the determined coefficient to produce a second adjusted signal; and mixing the first adjusted signal and the second adjusted signal to produce the harmonic signal.

6. The method of claim 1, wherein the first predetermined time is a predetermined sample number.

7. The method of claim 3, wherein the coefficient comprises a first coefficient and a second coefficient, and the first coefficient and the second coefficient have a sum being a constant.

8. The method of claim 1, wherein the step of comparing the audio input signal and the delayed signal further comprising: performing an absolute value operation on the audio input signal.

9. An apparatus for generating a harmonic signal, comprising: a first delay circuit to delay an audio input signal according to a predetermined time to generate a delayed signal; a comparing circuit to compare an audio input signal with the delayed signal to generate a compared result; and a computing circuit, coupled to the comparing circuit, to generate the harmonic signal based on the compared result and the audio input signal.

10. The apparatus of claim 9, wherein the comparing circuit generates the compared result according to the audio input signal, the delayed signal, and a constant value.

11. The apparatus of claim 9, wherein the computing circuit further comprises: a coefficient determining circuit coupled to the comparing circuit, to select one of a plurality of coefficients according to the compared result and generating a determined coefficient.

12. The apparatus of claim 11, wherein the computing circuit further comprises: a second delay circuit to delay the harmonic signal to generate a delayed harmonic signal; and a mixing circuit to mix the audio input signal and the delayed harmonic signal according to the determined coefficient to produce the harmonic signal.

13. The apparatus of claim 12, wherein the mixing circuit further comprises: a first multiplying circuit, coupled to the coefficient determining circuit, to adjust the audio input signal according to a first coefficient of the determined coefficient to generate a first processed signal; a second multiplying circuit, coupled to the first multiplying circuit and the delay circuit, to adjust the delayed harmonic signal according to a second coefficient of the determined coefficient to generate a second processed signal; and an adder to mix the first processed signal and the second processed signal to produce the harmonic signal.

14. The apparatus of claim 13, wherein the first coefficient is determined as a first value when the compared result is of a first condition, and the first coefficient is determined as a second value when the compared result is of a second condition.

15. The apparatus of claim 13, wherein the first coefficient and the second coefficient have a sum being a constant.

16. The apparatus of claim 12, wherein the first predetermined time is a predetermined sample number.

17. The apparatus of claim 9, further comprising: an absolute value processing circuit to perform an absolute value operation on the audio input signal, and to output the absolute value to the first delay circuit and the comparing circuit.

18. A non-transitory computer-readable medium comprising a program executable in a computing device, the program comprising: a delay code delaying an audio input signal according to a predetermined time to generate a delayed signal; a comparing code comparing an audio input signal with the delayed signal to generate a compared result; and an operating code generating the harmonic signal based on the compared result and the audio input signal.

* * * * *